United States Patent [19]

Sano

[11] Patent Number: 4,916,388
[45] Date of Patent: Apr. 10, 1990

[54] SEMICONDUCTOR INTEGRATED CIRCUIT DEVICE EQUIPPED WITH SCAN-PASS TYPE TEST CIRCUIT

[75] Inventor: Toshi Sano, Tokyo, Japan

[73] Assignee: NEC Corporation, Tokyo, Japan

[21] Appl. No.: 332,006

[22] Filed: Mar. 31, 1989

[30] Foreign Application Priority Data

Apr. 1, 1988 [JP] Japan .................................. 63-81484

[51] Int. Cl.⁴ ...................... G01R 31/28; G01R 15/12
[52] U.S. Cl. ................................. 324/158 R; 371/22.3
[58] Field of Search .......................... 324/158 R, 73 R; 307/480, 291, 272.2; 377/76; 371/22.3

[56] References Cited

U.S. PATENT DOCUMENTS

| | | | |
|---|---|---|---|
| 4,602,210 | 7/1986 | Fasang et al. ...................... | 324/73 R |
| 4,701,922 | 10/1987 | Kuboki et al. ...................... | 324/73 R |
| 4,780,666 | 10/1988 | Sakashita et al. ................ | 324/158 R |
| 4,796,095 | 1/1989 | Shimada ................................. | 377/76 |

Primary Examiner—Ernest F. Karlsen
Assistant Examiner—Vinh P. Nguyen
Attorney, Agent, or Firm—Helfgott & Karas

[57] ABSTRACT

A semiconductor integrated circuit device is disclosed, which includes a test circuit for facilitating A.C. characteristic test thereof. This test circuit includes a delay circuit, a first register for temporarily storing test data to be supplied to the delay circuit and a second register for temporarily storing data derived from the delay circuit. The delay circuit has a delay time approximately equal to a data propagation delay time on a critical path formed in the integrated circuit device. The device also includes a scan pass type test circuit for a function test thereof. The scan-in terminal is used to supply the test data to the first register and the scan-out terminal is used to receive data from the second register.

4 Claims, 7 Drawing Sheets

SEMICONDUCTOR INTEGRATED CIRCUIT DEVICE EQUIPPED WITH SCAN-PASS TYPE TEST CIRCUIT

BACKGROUND OF THE INVENTION

1. Field of the Invention

The present invention relates to a semiconductor integrated circuit device and, more specifically, to a circuit arrangement for facilitating a test of an integrated circuit device.

2. Description of Prior Art

The integration degree of semiconductor integrated circuit devices is every increasing as represented by VLSI's and ULSI's, so that the operational test such as D.C. characteristics test and A.C. characteristics test become more complex. At present, therefore, a serious problem is how to carry out the testings easily. As one of circuit design techniques circuits for facilitating the test of IC's, a scan-pass type test circuit has been proposed and put into practical use.

FIG. 1 shows a semiconductor integrated circuit device (IC), 100 equipped with a conventional the scan-path type test circuit. Symbols $I_1$, $I_2$, $I_{K-1}$ to $I_{K+1}$, and $I_m$ denote input terminals, reference numerals 31 to 33 denote logic gate combination circuits or data processing circuits, 34 and 35 denote registers. A scan-path may be formed by circuitting the combination circuits $I_1$ to $I_{k+1}$ and the registers 35 and 35. Symbols $F_{11}$ to $F_{1l}$ and $F_{21}$ to $F_{2r}$ denote flip-flops composing the registers 34 and 35. Symbols $S_{11}$ to $S_{1P}$, $S_{21}$ to $S_{2l}$, $S_{31}$ ro $S_{3Q}$ and $S_{42}$ to $S_{4r}$ denote signal lines, $O_1$ to $O_n$ denote output terminals, $S_{IN}$ denotes a shift-in (scan-in) terminal, $S_{IN1}$ denotes a shift-in signal line, $S_{OUT}$ denotes a shift-out (scan-out) terminal, $S_{OUT1}$ denotes a shift-out signal line of the register 34 and a shift-in signal line for the register 35, $S_{OUT2}$ denotes a shift-out signal line, and SMD is a designation signal for designating either one of a normal operating mode and a test mode, CLOCK denotes a clock terminal, $C_{LK1}$ denotes a clock signal line, and FB1 and FB2 denote feedback data lines.

When the signal SMD designates the normal operating mode, each of the registers 34 and 35 operates as a parallel register: or a temperary register. Under this mode, the first logic circuit 31 receives input data from the terminals $I_1$ to $I_m$ and feedback data from the lines FB1 and FB2 to perform predetermined operations on these data. Some of output data from the circuit 31 are temporarily stored in the register 34 in synchronism with the clock CLOCK and then supplied to the second logic circuit 32. The remaining output data are directly supplied to the second logic circuit 32. If desired, the register 34 can temporarily store the remaining output data. The second logic circuit 32 performs predetermined operations on the supplied data. Similarly, some of the output data from the circuit 32 are temporarily stored in the other register 35 in synchronism with the clock and supplied to the third logic circuit 33. The remaining output data are directly supplied to the third logic circuit 3. Selected data stored in the register 35 is further fed back to the first circuit 1. While the circuit 33 performs predetermined operations on the data supplied thereto, the output data therefrom are supplied to the output terminals $Q_1$ to $Q_n$.

On the other hand, the signal SMD designates the test mode, each of the registers 34 and 35 operates as a shift register. Under this mode, the test data is supplied to the registers 34 and 35 from the shift-in terminal SIN in synchronism with the clock signal supplied to the terminal CLOCK. After the desired test data are set into the registers 34 and 35, the IC 100 is brought into the normal operating mode with the input test data being supplied to the terminals $I_1$ to $I_m$. While the logic circuit 31, performs operations on the input test data, the other logic circuits 32 and 33 perform operations the test data supplied from the registers 34 and 35, respectively. the result data derived from the circuits 31 and 32 are stored again in the registers 34 and 35, respectively, to be read out from the terminals $O_1$ to $O_n$ through the shift register constructed by the registers 34 and 35. The operations of IC 100 is checked by the result data derived from the registers 34 and 35 through the shift-out terminal $S_{OUT}$ in synchronism with the clock signal. Thus, the operational tests of the logic circuits 31 to 33 can be carried out independently of each other, so that the operational test of the IC 100 is facilitated.

However, this IC 100 requires a very long test time for carrying out A.C. characteristic test. More specifically, the IC 100 includes a critical data propagation path requiring very long time for propagating data therethrough. In the A.C. characteristic test, the data propagation delay time on this critical path should be measured. The data propagates through the critical path only when the circuits 31, 32 and 33 satisfy particular conditions. To this end, complicated test data are required to be set in the IC 100 a plurality times. For this reason, a long A.C. test time is required.

SUMMARY OF THE INVENTION

Therefore, an object of the present invention is to provide a semiconductor device equipped with a circuit arrangement for facilitating A.C. characteristic test.

Another object of the present invention is to provide a semiconductor integrated circuit device including a circuit for measuring a data propagation delay time on a critical data path.

A semiconductor device according to the present invention includes a data processing circuit, a plurality of first registers for temporarily storing data to be processed by the data processing circuit, a plurality of second registers for temporarily storing data derived from the data processing circuit, a scan-in terminal supplied with test data in a test mode, a scan-out terminal, one of the first registers being coupled to the scan-in terminal to receive the test data in the test mode and supply the test data to one of the second registers, the one second register being coupled to the scan-out terminal: to supply in the test mode thereto data stored therein in synchronism with the clock signal, a first flip-flop coupled to the scan-in terminal for temporarily storing the test data, a second flip-flop coupled to the scan-out terminal for outputting data stored therein, and a delay circuit coupled between the first and second flip-flops, the delay circuit having a delay time approximately equal to a data propagation delay time on a critical data path of the data processing circuit and the second flip-flops temporarily storing data derived from the delay circuit.

Accordingly, A.C. characteristic test of this semiconductor device is facilitated by utilizing the scan-in and scan-out terminals, first and second flipflops and the delay circuit. Since this device is further equipped with the scan pass type test circuit, the function test is also facilitated.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
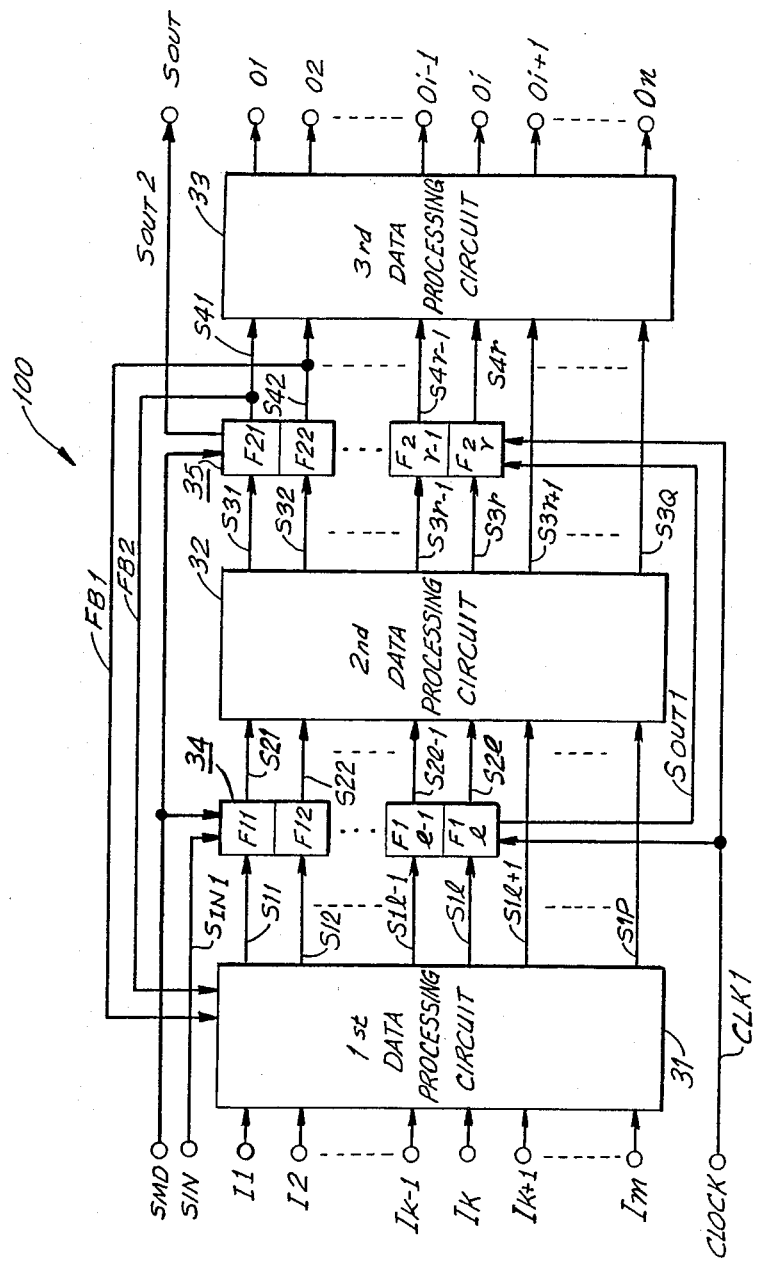
FIG. 1 is a block diagram representative of a integrated circuit device according to prior art.
Figure 2:
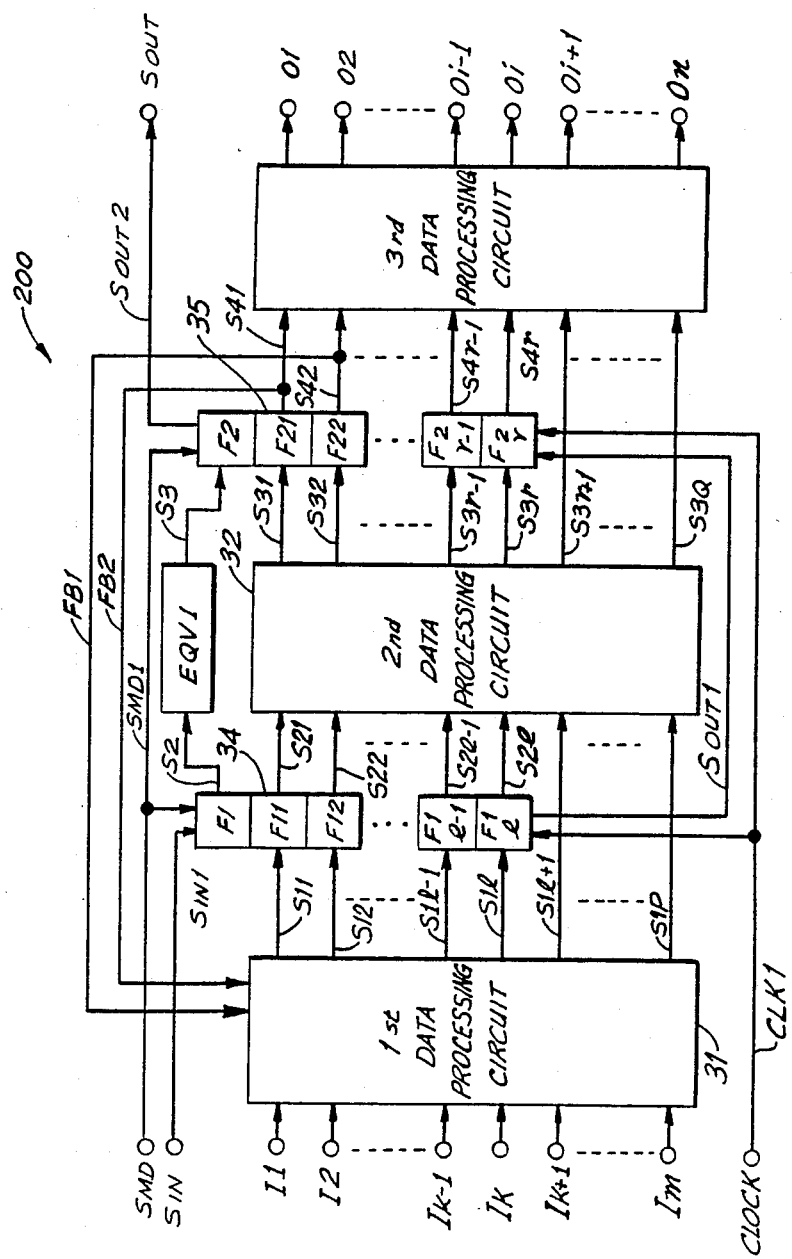
FIG. 2 is a block diagram representative of a integrated circuit device according to an embodiment of the present invention.

FIG. 2 shows a semiconductor integrated circuit device (IC) 200 according to an embodiment of the present invention, in which the same constituents as those shown in FIG. 1 are denoted by the same symbols and reference numerals to omit further description thereof. This IC 200 is different from the IC 100 shown in FIG. 1 in that there are further provided two one-bit registers (or flip-flops) F1 and F2 and one equivalent delay circuit EQV1. The input node of the register F1 is connected to the scan-in terminal SIN via a line SIN1 and the output node thereof is connected to the input node of the circuit EQV1 via a line S2. The input node of the register F2 is connected to the output node of the delay circuit EQV1 and the output node thereof is connected to the scan-out terminal SOUT. The delay time of the delay circuit EQV1 is pre-selected to be approximately equal to the data propagation time on a critical data propagation path formed in the IC 200. In the present description, this critical data propagation path exists in the second data processing circuit 32.

Figure 3:
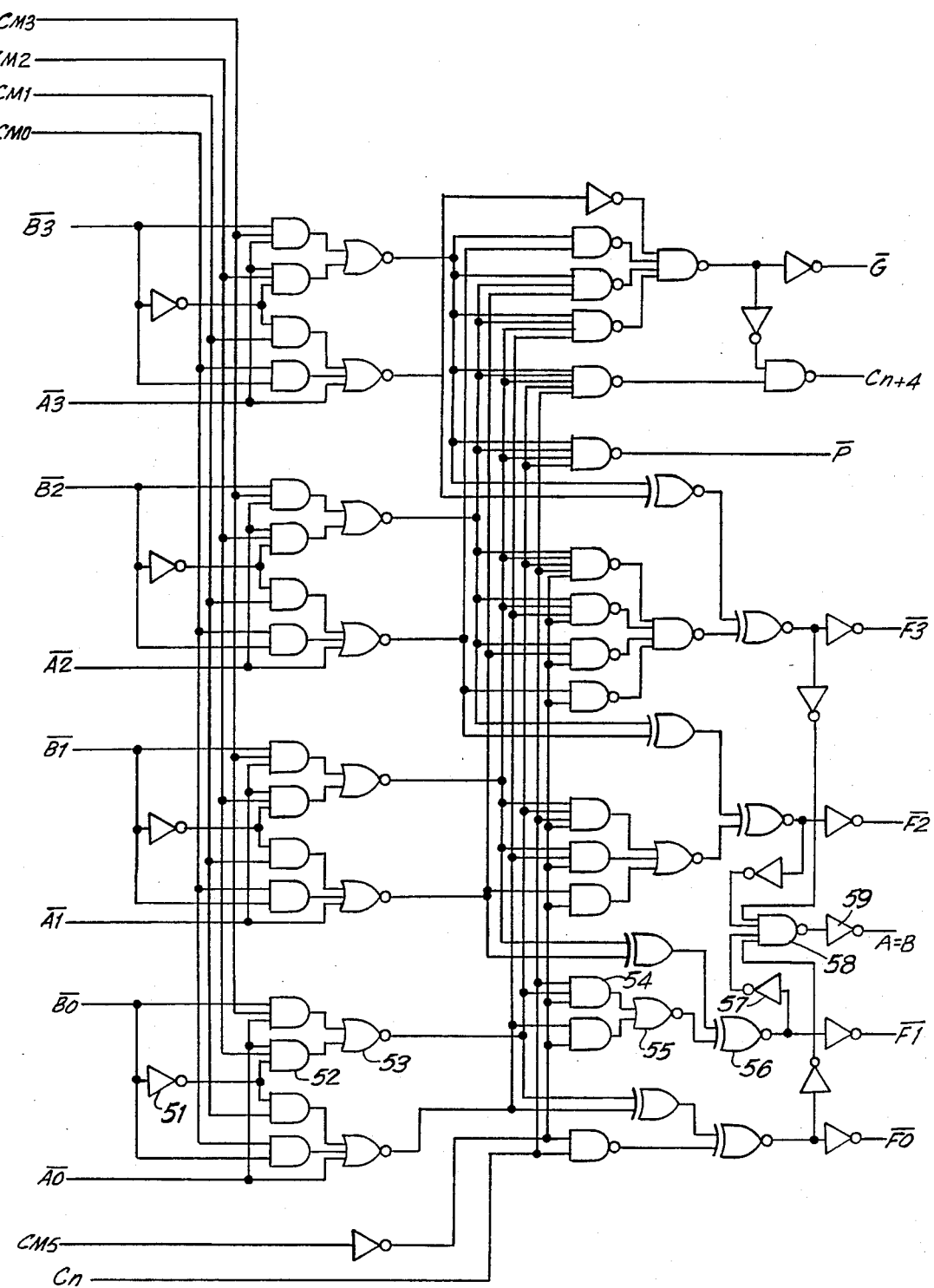
FIG. 3 is a circuit diagram of one of data processing circuits shown in FIG. 2.

Referring to FIG. 3, an arithmetic and logic unit (ALU) is shown as an example of the circuit 32. $\overline{A0}$ to $\overline{A3}$ represent four bits of first operand data and $\overline{B0}$ to $\overline{B3}$ represent four bits of second operand data. CM0 to CM5 represent command code data indicative of an operation to be performed by the ALU. Cn is a carry signal from lower order data. The operation result data are indicated by $\overline{F0}$ to $\overline{F3}$ and "A=B", and carry information for upper order data is indicated by $C_{n+4}$, $\overline{P}$ and $\overline{G}$. As the result of computer simulation, the critical data propagation path has been represented by a path from the $\overline{B0}$ input to the "A=B" output including an inverter 51, a 3-input AND gate 52, a 2-input NOR gate 53, a 3-input AND gate 54, a 2-input NOR gate 55, a 2-input exclusive NOR gate 56, an inverter 57, a 4-input NAND gate 58 and an inverter 59.

Figure 4:
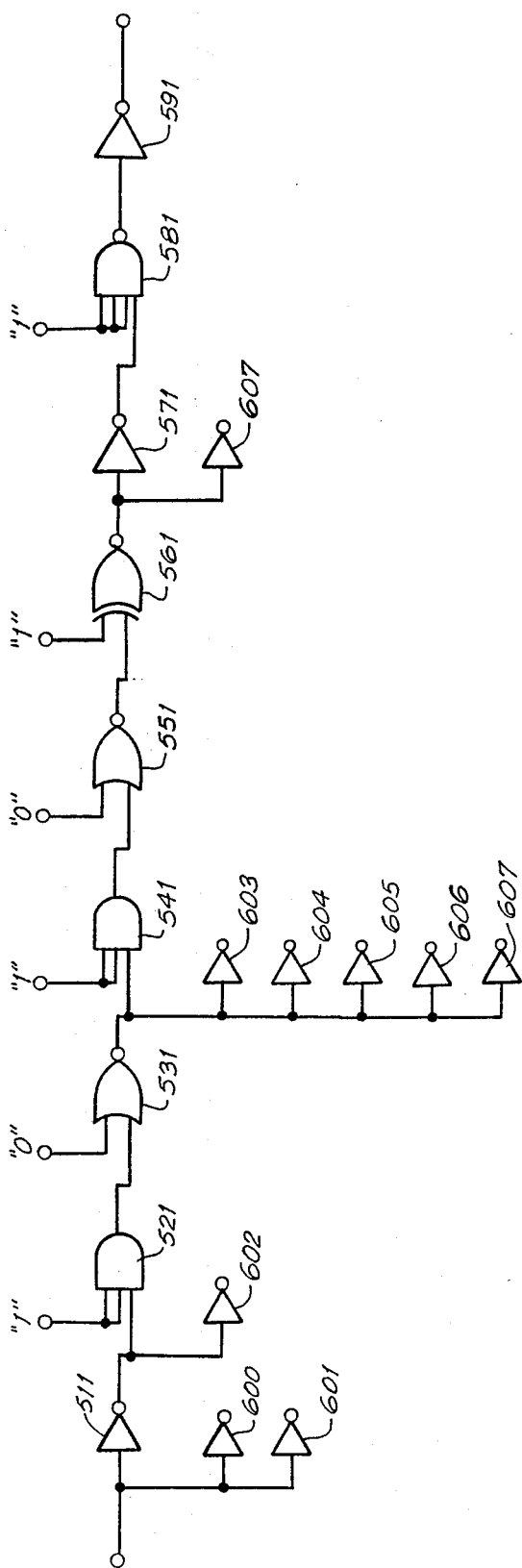
FIG. 4 is a circuit diagram of an equivalent delay circuit shown in FIG. 2.

Therefore, as shown in FIG. 4, the equivalent delay circuit EQV1 consists of an inverter 511, a 3-input AND gate 521, a 2-input NOR gate 531, a 3-input AND gate 541, a 2-input NOR gate 551, a 2-input exclusive NOR gate 561, an inverter 571, a 4-input NAND gate 581 and an inverter 591 connected in series. Moreover, in order to match fan-out numbers between the critical data path of the ALU and the path of the delay circuit EQV1, inverters 600 to 607 are provided. The stray capacitance of the interconnection lines of the circuit EQV1 is also matched with that of the critical path of the ALU. In order to bring the gates 521 to 561 and 581 into an open state, logic "1" or "0" is supplied selectively thereto, as shown in FIG. 4.

Figure 5A:
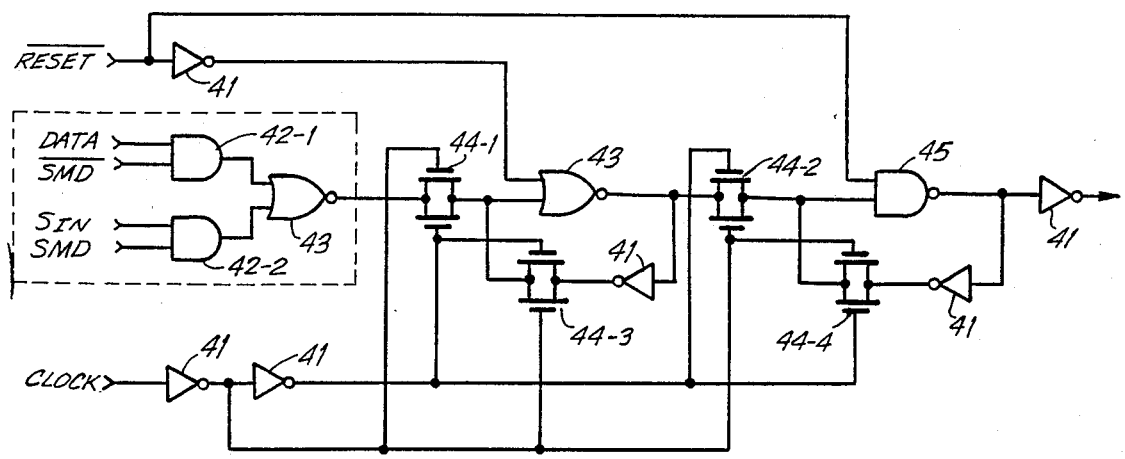
FIG. 5A, 5B and 5C are circuit diagrams of data storage circuits shown in FIG. 2.
Figure 5B:
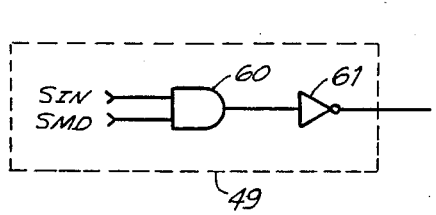
Figure 5C:
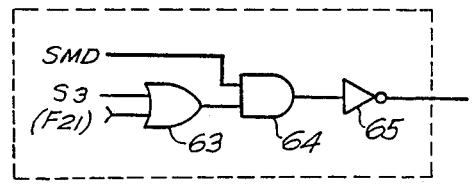

Turning to FIG. 5A, each of the flip-flops of the registers 34 and 35 includes two AND gates 42-1 and 42-2, two NOR gates 43, one NAND gate 45, six inverters 41, and four transfer gates 44-1 to 44-4, which are connected as shown. When the signal SMD takes logic "0" to designate the normal operating mode, the AND gate 42-1 is made open and the AND gate 42-1 is made closed. Therefore, the output data derived from the circuits 1 and 2 are stored into the registers 34 and 35, respectively. On the other hand, in the case of the signal SMD taking logic "1" to designate the test mode, the AND gate 42-1 is made closed and the AND gate 42-2 is made open. Therefore, the test data supplied to the shift-in terminal SIN is stored in the registers 34 and 35. The transfer gates 44-1 and 44-4 are made open when the clock signal is at the high level, and the gates 44-2 and 44-3 are made open when the clock signal is at the low level. Accordingly, the data supplied to each flip-flop is catched therein in response to the leading each of the clock signal and outputted therefrom in response to the falling edge thereof. In the case of the flip-flop F1, the circuit portion 49 shown in FIG. 5A is replaced by an AND gate 60 and an inverter 61, as shown in FIG. 5B. In the flip-flop F2, the portion 49 is replaced by an OR gate 63, an AND gate 64 and an inverter 65, as shown in FIG. 5C.

Next, an operation of the IC 200 will be described below. However, the operations under the normal operating mode and the function test mode of the IC 200 are the same as those of the IC 100 shown in FIG. 1, and hence only the operation for A.C. characteristic test will be described with reference to FIG. 6.

Figure 6:
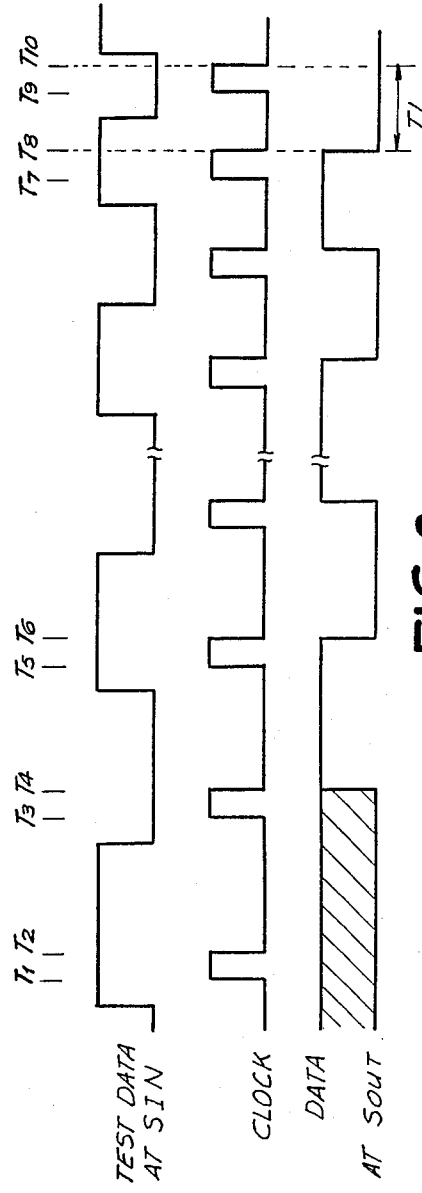
FIG. 6 is a timing chart representative of A.C. test method of the device shown in FIG. 2.

In the A.C. characteristic test mode, the rate of the clock signal supplied to the terminal CLOCK is made high little by little, as shown in FIG. 6. In accordance with that, the rate in change of the test data supplied to the shift-in terminal SIN is made high, as shown in FIG. 6. The flip-flop $F_1$ latches test data logic "1" at a timing $T_1$ and outputs it at a timing $T_2$. This test data logic "1" is thereby propagated through the equivalent delay circuit EQV1. At a timing $T_3$, the flip-flop $F_2$ latched the data supplied thereto and, at a timing $T_4$, it outputs the latched data. Since the test data logic "1" reaches the flip-flop $F_2$ before the timing $T_3$, the shift-out terminal SOUT is changed to the logic "1" at the timing $T_4$. On the other hand, the flip-flop $F_1$ latches test data logic "0" at the timing $T_3$ and outputs it at the timing $T_4$. This test data logic "0" is then propagated through the delay circuit EQV1. Since the test data logic "0" reaches the flip-flop $F_2$ before a timing $T_5$, the shift-out terminal SOUT is changed to the logic "0" at a timing $T_6$. So long as the alternate test data logic levels reach the flip-flop $F_2$ before the each leach edge of the clock signal, the logic level at the shift-out terminal SOUT is changed alternately, as shown in FIG. 6. At a timing $T_7$, the flip-flop $F_1$ latches the test data logic "1" and at a timing $T_8$, outputs it. The logic "1" is propagated through the delay circuit EQV1. Assuming that the leading edge of the clock signal appears at a timing $T_9$ before the logic "1" is outputted from the delay circuit EQV1, the flip-flop $F_2$ latches the previous logic "0" at the timing $T_9$ and outputs it at a timing $T_{10}$. For this reason, the shift-out terminal SOUT is held at the low level. Therefore, a time TL between the timings $T_5$ and $T_{10}$ (or $T_7$ and $T_9$) represents the maximum clock rate at which the IC 200 operates correctly. The A.C. characteristic test is thus carried out for a very short time.

Figure 7:
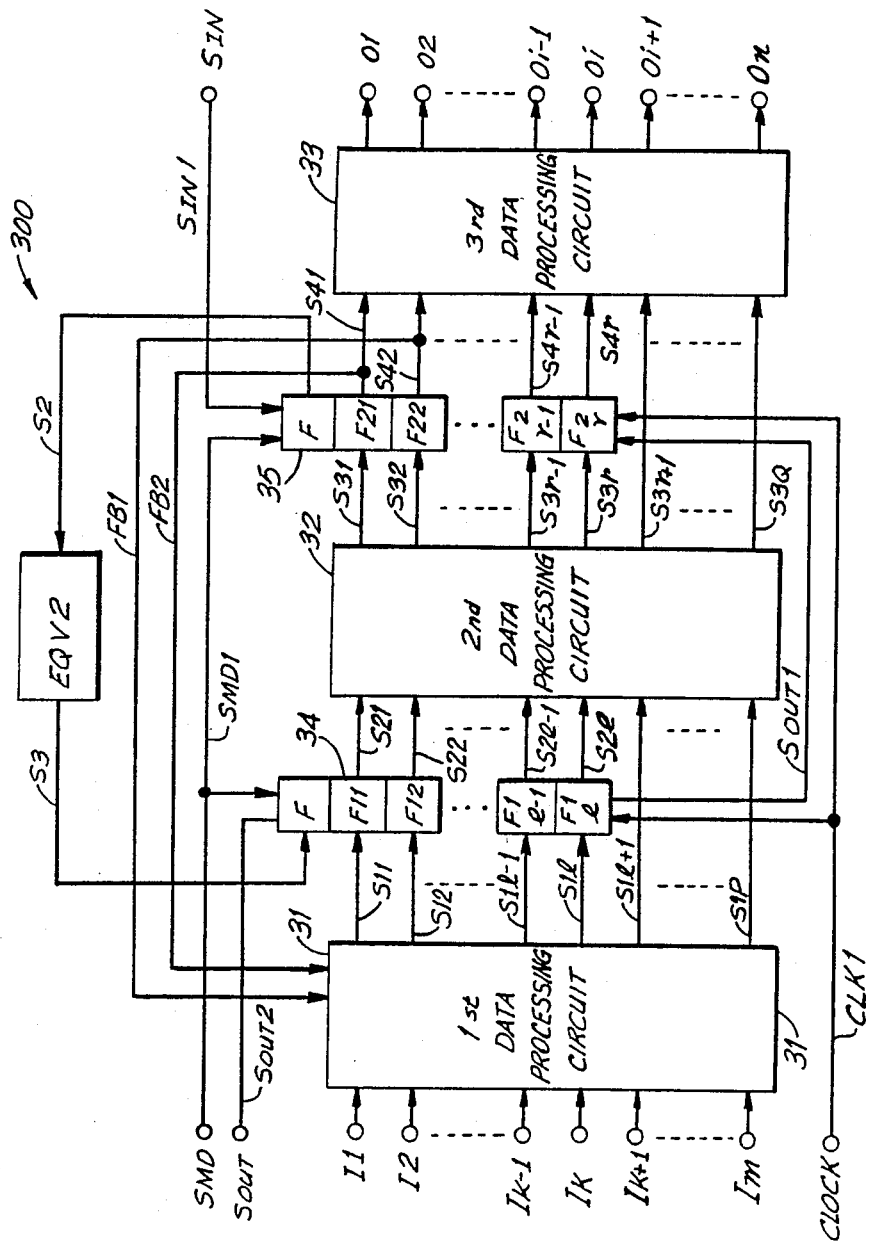
FIG. 7 is a block diagram representative of a semiconductor device according to another embodiment of the present invention.

Referring to FIG. 7, there is shown an IC 300 according to another embodiment of the present invention, wherein the same constituents as those shown in FIG. 2 are denoted by the same symbols and reference numerals. In this IC 300, the test data to the scan-in terminal SIN is supplied to the flip-flop $F_2$ and transferred to the register 35. The test data derived from the register 35 is then supplied to the register 34. Therefore, the flip-flop $F_1$ is provided on the side of the register 35 and the flip-flop $F_2$ is provided on the side of the register 34.

If the critical data propagation path exists in the feedback data processing pass of the first circuit 31, the delay circuit EQV2 is designed to have a delay time on that path.

The present invention is not limited to the above embodiment, but may be changed and modified without departing from the scope and spirit of the invention. For example, two of the terminals $I_1$ to $I_m$ and $O_1$ to $O_n$ can be used as the shift-in and shift-out terminals SIN and SOUT, respectively.

What is claimed is:

1. A semiconductor device comprising a data processing circuit, first storage means for temporarily storing test data to be processed by said data processing circuit, second storage means for temporarily storing test data outputted from said data processing circuit, a scan-in terminal supplied with test data in a test mode, a scan-out terminal, means coupled to said scan-in terminal and said first storage means for supplying in said test mode said test data to said first storage means in synchronism with a clock signal, means coupled to said scan-out terminal and said second storage means for supplying in said test mode test data stored in said second storage means to said scan-out terminal, third storage means coupled to said scan-in terminal for temporarily storing the test data in synchronism with said clock signal, a delay circuit having an input node connected to said third storage means to receive the test data stored therein and an output node, and fourth storage means coupled between the output node of said delay circuit and said scan-out terminal for temporarily storing test data appearing at the output node of said delay circuit and supplying the stored test data to said scan-out terminal in synchronism with said clock signal.

2. The device as claimed in claim 1, wherein said data processing circuit includes a plurality of data propagation paths and said delay circuit has a delay time approximately equal to a data propagation delay time on one of said data propagation paths.

3. The device as claimed in claim 2, wherein the data propagation delay time on said one data propagation path is largest.

4. A semiconductor device as claimed in claim 3, wherein each of said first and second storage means includes a plurality of registers which are interconnected to form a shift register.

* * * * *